(12) United States Patent
Lin et al.

(10) Patent No.: US 8,344,600 B2
(45) Date of Patent: Jan. 1, 2013

(54) HEAT DISSIPATING STRUCTURE OF LED CIRCUIT BOARD AND LED LAMP TUBE COMPRISED THEREOF

(75) Inventors: Kuo-Len Lin, Wugu Township, Taipei County (TW); Chen-Hsiang Lin, Wugu Township, Taipei County (TW); Hwai-Ming Wang, Wugu Township, Taipei County (TW); Ken Hsu, Wugu Township, Taipei County (TW); Chih-Hung Cheng, Wugu Township, Taipei County (TW)

(73) Assignees: CPUMate Inc., New Taipei (TW); Golden Sun News Techniques Co., Ltd., New Taipei (TW)

( * ) Notice: Subject to any disclaimer, the term of this patent is extended or adjusted under 35 U.S.C. 154(b) by 343 days.

(21) Appl. No.: 12/211,965

(22) Filed: Sep. 17, 2008

(65) Prior Publication Data

US 2010/0066230 A1    Mar. 18, 2010

(51) Int. Cl.
*H01J 1/02* (2006.01)
(52) U.S. Cl. .......................................... 313/11
(58) Field of Classification Search ............... 106/632; 313/11
See application file for complete search history.

(56) References Cited

U.S. PATENT DOCUMENTS

| 5,782,555 | A  | * | 7/1998 | Hochstein | 362/373 |
| 7,404,853 | B2 | * | 7/2008 | Kendall | 106/403 |
| 2007/0081340 | A1 | * | 4/2007 | Chung et al. | 362/294 |
| 2008/0055908 | A1 | * | 3/2008 | Wu et al. | 362/294 |
| 2008/0076856 | A1 | * | 3/2008 | Zhong et al. | 524/81 |

OTHER PUBLICATIONS

Lin et al., "Electrically Nonconductive Thermal Pastes with Carbon as Thermally Conductive Component," 2007, Journal of Electronic Materials, vol. 36, No. 6, pp. 659-668.*

* cited by examiner

*Primary Examiner* — Anh Mai
*Assistant Examiner* — Britt D Hanley
(74) *Attorney, Agent, or Firm* — Chun-Ming Shih; HDLS IPR Services

(57) ABSTRACT

A heat dissipating structure of an LED circuit board includes an LED circuit board having a plurality of soldering points. The soldering points of the LED circuit board are covered by a coating layer including Nanoparticles and a bonding agent. The LED circuit board is covered by the coating layer in an LED lamp tube to accelerate dissipating the heat of the LED circuit board. The coating layer has the characteristics of high emitting rate, temperature resistance, and conductivity insulation. On the other hand, the coating layer can increase the contacting areas of the soldering points with the air to enlarge the heat dissipation area of the LED circuit board to, thereby accelerating dissipating the heat.

16 Claims, 5 Drawing Sheets

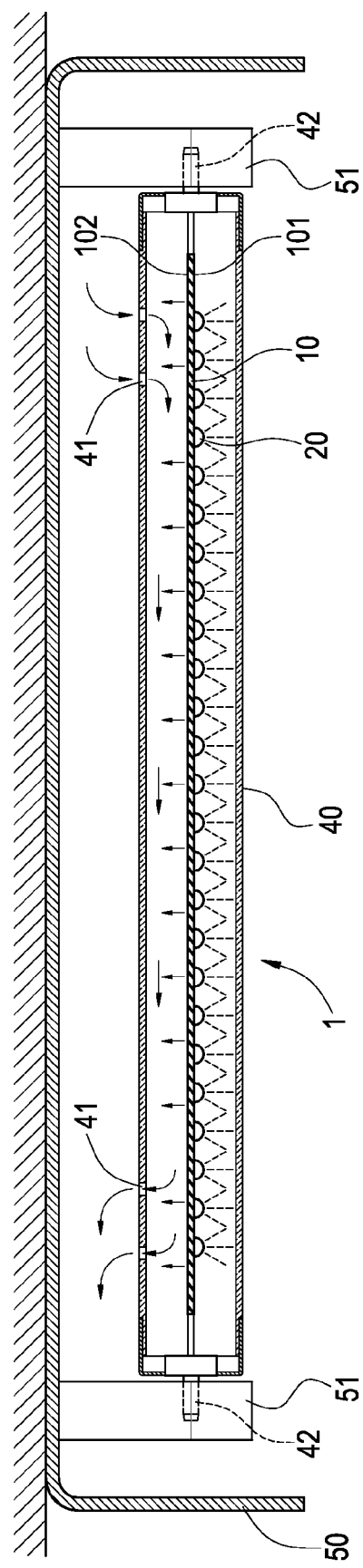

US 8,344,600 B2

HEAT DISSIPATING STRUCTURE OF LED CIRCUIT BOARD AND LED LAMP TUBE COMPRISED THEREOF

BACKGROUND OF THE INVENTION

1. Field of the Invention

The present invention generally relates to heat dissipation, in particular to a heat dissipating structure of an LED lamp.

2. Description of Prior Art

As light emitting diodes (LEDs) come with the features of low power consumption, power saving, long service time, small size and quick response etc., LED lamps gradually substitute traditional light sources, such as an LED lamp tube.

With reference to FIG. 1 for the structure of LEDs applied in a lamp tube, a tube 10a includes a circuit board 20a on which a plurality of LEDs 30a are mounted, two bushings 40a separately sheathing both ends of the tube 10a. Each of the bushings 40a includes two conductive terminals 401a. The LED lamp tube is installed in a lamp holder by the conductive terminals 401a on both ends for electrically conducting a power source to the LEDs 30a and emitting light.

Although light the LEDs 30a of the LED lamp tube only needs less power, the lighted LEDs accompany a large quantity of heat, which will result in a high temperature on the circuit board 20a. If the heat cannot be dissipated from the circuit board 20a effectively and timely, the electric components on the circuit board 20a will be destroyed. Hence, the maintenance cost will increase.

SUMMARY OF THE INVENTION

Accordingly, an object of the present invention is to provide a heat dissipating structure of an LED circuit board, which can improve the heat dissipation efficiency of an LED circuit board.

In order to achieve the object mentioned above, the present invention provides a heat dissipating structure of an LED circuit board, comprising a coating layer covering on soldering points of the LED circuit board. The coating layer is composed of Nanoparticles and a bonding agent.

Another object of the present invention is to provide a heat dissipating structure of an LED circuit board which can enlarge the heat dissipating areas of the LED circuit board to accelerate the heat dissipating.

A further object of the present invention is to provide a heat dissipating structure of an LED circuit board, which can prevent the LED circuit board from short circuit resulting from infiltration of water. The LED circuit board also has characteristics of oxidation-resistant, acid-resistant and alkali-resistant to increase the durability and service time of the LED circuit board.

In order to achieve objects mentioned above, the present invention provides an LED lamp tube including a heat dissipating structure of an LED circuit board. The LED lamp tube includes an LED circuit board having a light radiating surface and a heat dissipating surface and a coating layer covering and contacting with the soldering points of the LED circuit board and a lamp tube for containing the LED circuit board. The heat dissipating surface disposes a plurality of soldering points thereon and the light radiating surface disposes a plurality of LEDs thereon. The coating layer is composed of Nanoparticles and a bonding agent. The lamp tube has a plurality of heat dissipation holes disposed on the left and right sides of the tube. The heat dissipating holes face toward the heat dissipating surface of the LED circuit board.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

FIG. 5 is a schematic view of an application of the LED lamp tube comprising the heat dissipating structure of the LED circuit board in accordance with the present invention.

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
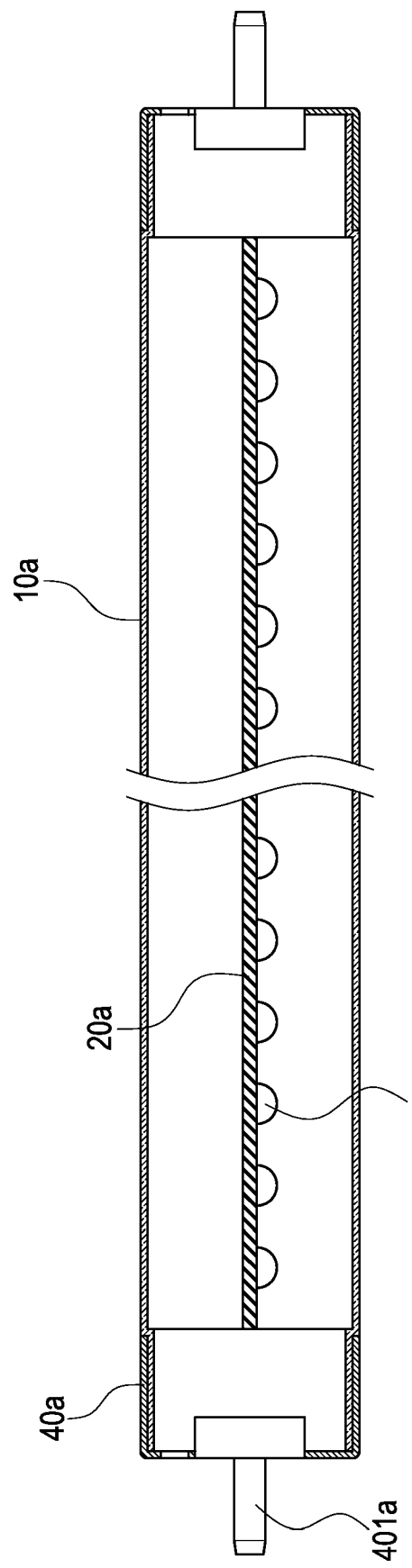
FIG. 1 is a schematic view showing a conventional LED lamp tube.
Figure 2:
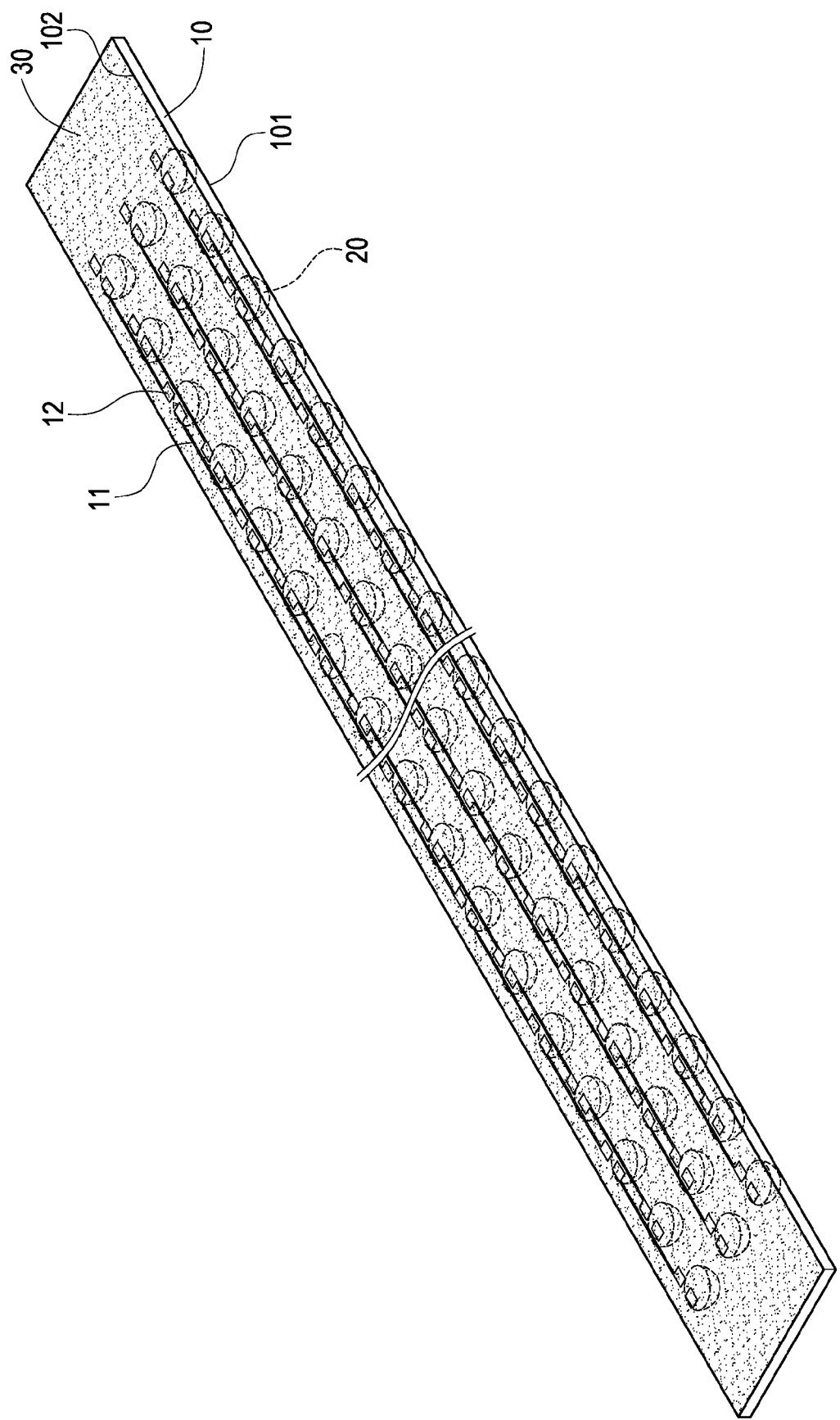
FIG. 2 is a perspective view of a heat dissipating structure of an LED circuit board according to the present invention.

With refer to FIG. 2, a perspective view of a heat dissipating structure of an LED circuit board of the present invention is shown. The invention is a heat dissipating structure of an LED circuit board. A preferable embodiment of the invention comprises an LED circuit board 10, which has a light radiating surface 101 and a heat dissipating surface 102. A plurality of LEDs 20 are electrically mounted on the light radiating surface 101 of the LED circuit board 10 and are arranged with an interval. The heat dissipating surface 102 of the LED circuit board 10 is provided with copper foil 11 and soldering points 12. A coating layer 30 composed of Nanoparticles and a bonding agent is attached on the heat dissipating surface 102 to cover the soldering points 12 of the LED circuit board 10. Preferably, the coating layer 30 also can cover the whole area of the heat dissipating surface 102.

The coating layer 30 comprises 70%~80% weight of Nanoparticles, 10%~20% weight of the bonding agent and 10%~15% weight of a solvent. The Nanoparticles of high emitting rate are heat radiation Nanoparticles, include clay, or Nano-$SiO_2$, or far infrared ceramic particles (sinter combinations of $ZrSiO_4$, $Al_2O_3$, and $TiO_2$,(Ce,La,Nd)$PO_4$) or their combinations. In addition, some solvent (about 10%~15% weight) is added to the Nanoparticles and mixed with a bonding agent. The bonding agent can be one of polyimide resin, acrylic resin and poly-ester resin. Because the bonding agent is durable of high temperature ($\geqq 250°$ C.), radiation, burning, impaction and abrasion, it has the characteristics of good dielectric property, small linear expansion coefficient and not easily be melt. The bonding agent mixes with the heat radiation Nanoparticles to form the coating layer 30 (the best thickness is 10 micrometer to 30 micrometer). Because the coating layer 30 is a nano-scale radiation coating, it can improve the heat radiation coefficient of the LED circuit board 10 for having high heat dissipation rate, and it also be waterproof. When the external moisture is attached to the surface of the LED circuit board 10, the coating layer 30 can prevent the copper foil 11 of the LED circuit board from shorting. The coating layer 30 also has the characteristics of temperature resistance, strength, durability and aesthetics.

The Nanoparticles also can be Boron Nitride particles. By adding waterborne or discrete oiliness parting agent and mixing with the bonding agent, another one coating layer 30 (the best thickness is 10 micrometer to 25 micrometer) can be formed. Because the Boron Nitride particles are inorganic particles of excellent adhesions and chemical stability, they are also good insulating heat conduction materials. Mixing with the bonding agent of high temperature resistance and non-pollution will make the coating layer 30 to be an insulation and oxidation-resistant material of high heat dissipation, high radiation, high temperature resistance and acid-resistant and alkali-resistant. To take one kind of the above coating layers 30 to coat on the soldering points 12 of the LED circuit board 10 can make the surface of the LED circuit board 10 have high heat dissipation rate. Besides, the coating layer 30 can increase the contacting areas of the soldering points 12 with the air to accelerate the heat dissipating. the coating layer 30 is an excellent heat dissipation material for the circuit board.

Figure 3:
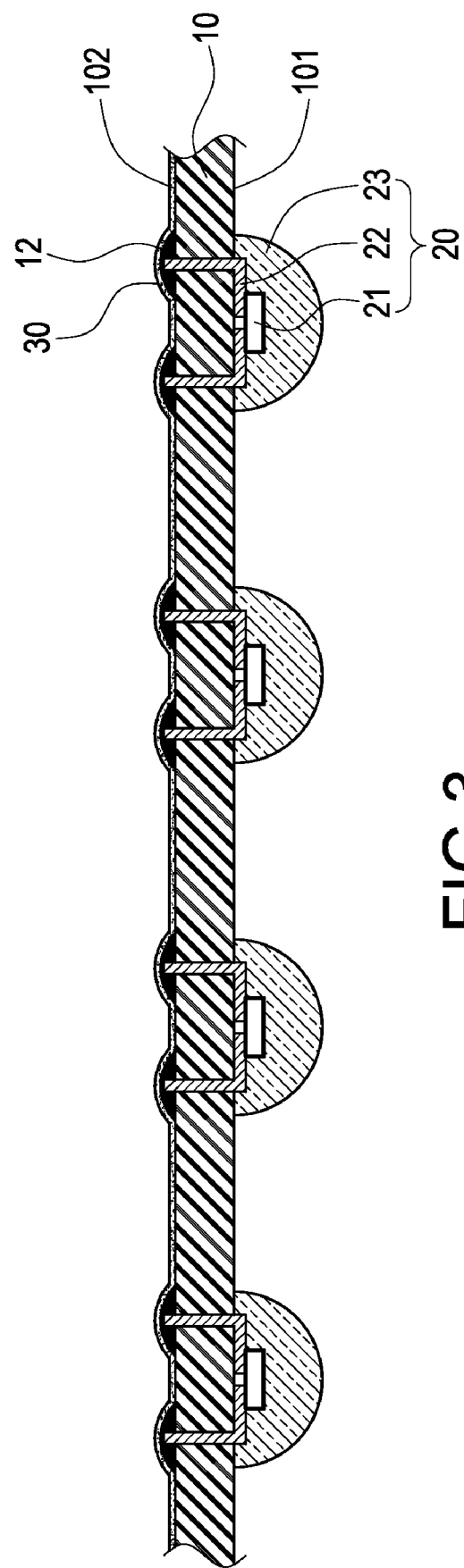
FIG. 3 is a partial cross-sectional view of the heat dissipating structure of the LED circuit board according to the present invention.

Please refer to FIG. 3, a partial cross-sectional view of the heat dissipating structure of the LED circuit board which is applied in an LED lamp tube of the present invention is shown. The LED 20 comprises a light emitting chip 21, a plurality of conductive pins 22 and a light transmitting lens 23 coupled on the light radiating surface 101 of the LED circuit board 10. The light transmitting lens 23 encloses sealedly the light emitting chip 21 and the conductive pins 22. The conductive pins 22 are disposed through the LED circuit board 10 and the soldering points 12 are formed on the other side (the heat dissipating surface 102) of the LED circuit board 10. The soldering points 12 are coated with the coating layer 30.

Figure 4:
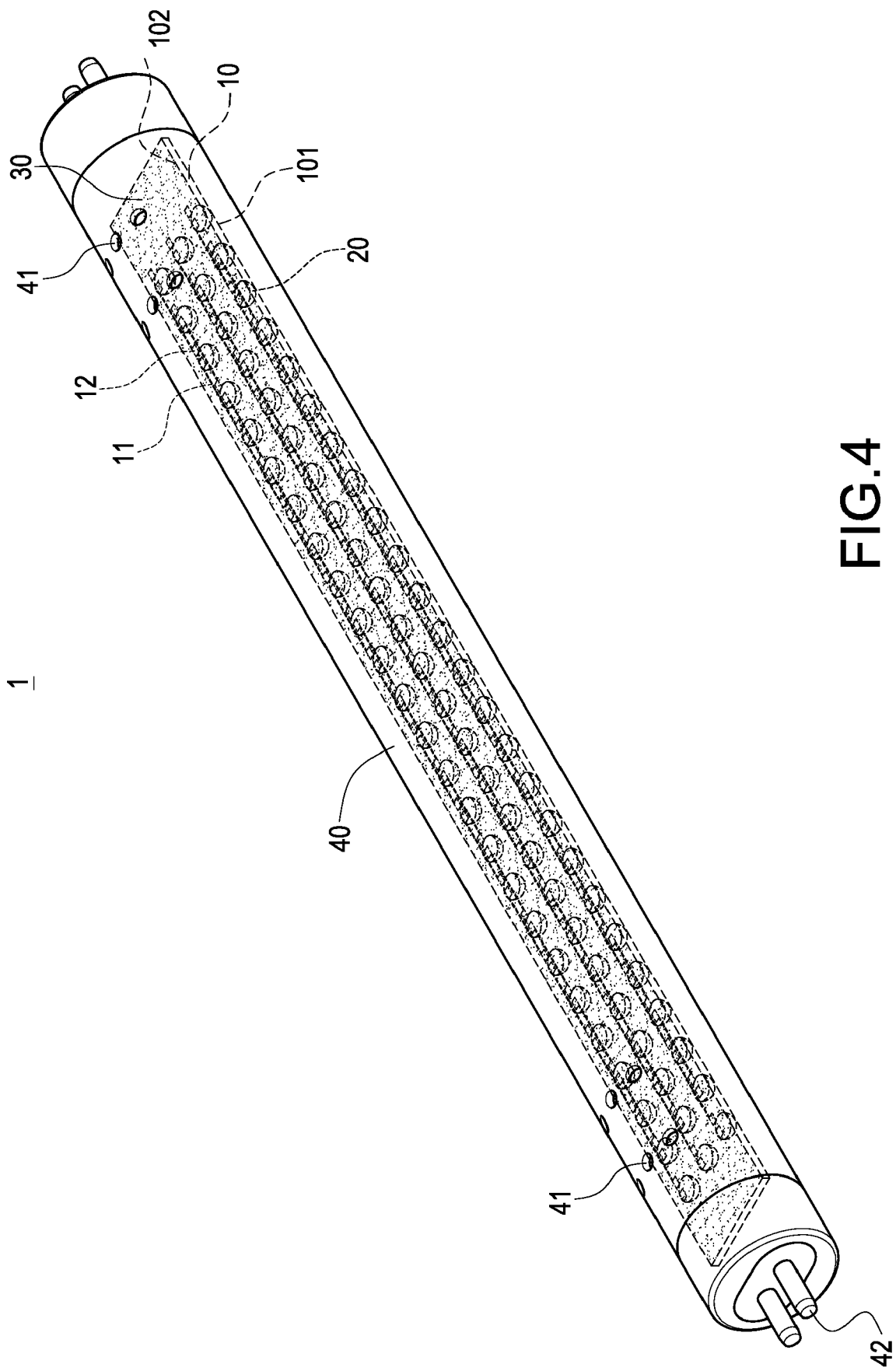
FIG. 4 is a perspective view of an LED lamp tube comprising the heat dissipating structure of the LED circuit board according to the present invention.

FIGS. 4 and 5 are a perspective view of the LED lamp tube comprising the heat dissipating structure of the LED circuit board and a schematic view of an application respectively. The LED lamp tube 1 comprises a lamp tube 40 which is made of a light transmitting plastic material. The LED circuit board 10 has the light radiating surface 101 and the heat dissipating surface 102, and the heat dissipating surface 102 disposes a plurality of soldering points 12 thereon. The soldering points 12 are coated with the coating layer 30, the LED circuit board 10 is contained in the lamp tube 40, and conductive terminals 42 are on both ends of the lamp tube 40. Hence, the LED lamp tube 1 including the heat dissipating structure of the LED circuit board 10 is completed. In this embodiment, a plurality of heat dissipation holes 41 is disposed on the left and right sides of the lamp tube 40, which face toward the heat dissipating surface 102 of the LED circuit board 10. In a preferable embodiment, the middle of the lamp tube 40 can also be provided with the heat dissipation holes 41 which face toward the heat dissipating surface 102 of the LED circuit board 10.

The LED lamp tube 1 is installed in a lamp holder 50, and the lamp holder 50 includes a socket 51. The electric conducting terminals 42 on both ends of the lamp tube 40 are plugged into the socket 51, such that a power source is conducted to drive the LEDs 20 on the light radiating surface 101 of the LED circuit board 10 to emit light. After using a period of time, heat produced by the LEDs 20 is dissipated from the heat dissipating surface 102 of the LED circuit board 10 and gathered in the lamp tube 40. The soldering points 12 are coated with the coating layer 30 to accelerate the speed of the heat radiation. The coating layer 30 increases the contacting areas of the soldering points 12 with the air to enlarge the heat dissipation area of the LED circuit board 10 to accelerate dissipating the heat from the lamp tube 40. In the mean time, external air enters into the lamp tube 40 from the heat dissipation holes 41 on one side of the lamp tube 40. The air absorbs the heat inside of the lamp tube 40 and conducts along the internal wall of the lamp tube 40, and the heated air is dissipated to the outside directly from the heat dissipating holes 41 on the other side of the lamp tube 40 to carry away the heat. When the middle of the lamp tube 40 also disposes the heat dissipation holes 41 therein, external air enters into the lamp tube 40 from the heat dissipation holes 41 on the middle of the lamp tube 40, and the heated air is dissipated to the outside directly from the heat dissipating holes 41 on both sides of the lamp tube 40.

Because the coating layer 30 has the characteristics of high emitting factor (high radiation), temperature resistance, and conductivity insulation, the heat dissipating structure of the LED circuit board and the LED lamp tube of the present invention can accelerate dissipating the heat produced by the LED circuit board 10. Besides, the coating layer 30 increases the contacting areas of the soldering points with the air and has the characteristics of waterproof, oxidation-resistant, and acid-resistant and alkali-resistant, thereby accelerating the heat dissipating and increasing the durability and service time of the LED circuit board. According to the above, the present invention really achieves the desired objects and solves the drawbacks of prior art. Further, the present invention indeed has novelty and inventive steps, and thus conforms to the requirements for a utility model patent.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A heat dissipating structure of an LED (light emitting diode) circuit board, comprising:
   an LED circuit board having a light radiating surface and a heat dissipating surface opposite to the light radiating surface, a plurality of LEDs being disposed on the light radiating surface and each LED having two conductive pins penetrating through the LED circuit board to protrude out from the heat dissipating surface, a plurality of soldering points being formed on the heat dissipating surface and each soldering point completely covering each conductive pin; and
   a coating layer coating on the heat dissipating surface to cover and contact with the soldering points of the LED circuit board, wherein the coating layer is composed of Nanoparticles and a bonding agent, and is exposed to the environment,
   wherein the Nanoparticles are heat radiative Nanoparticles which comprise clay and far infrared ceramic in sinter combinations of $ZrSiO_4$, $Al_2O_3$, $TiO_2$, and $(Ce,La,Nd)PO_4$ particles.

2. The heat dissipating structure of an LED circuit board according to claim 1, wherein the coating layer comprises 70%~80% weight of Nanoparticles, 10%~20% weight of the bonding agent and further comprising 10%~15% weight of solvent.

3. The heat dissipating structure of an LED circuit board according to claim 1, wherein the thickness of coating layer is 10 micron to 30 micron.

4. The heat dissipating structure of an LED circuit board according to claim 1, wherein the Nanoparticles are Boron Nitride particles.

5. The heat dissipating structure of an LED circuit board according to claim 3, wherein the coating layer comprises 70%~80% weight of Nanoparticles, 10%~20% weight of the bonding agent and further comprising 10%~20% weight of parting agent.

6. The heat dissipating structure of an LED circuit board according to claim 3, wherein the thickness of coating layer is 10 micron to 25 micron.

7. The heat dissipating structure of an LED circuit board according to claim 1, wherein the bonding agent is polyimide resin, acrylic resin or poly-ester resin.

8. An LED tube including a heat dissipating structure of an LED circuit board, comprising:

- an LED circuit board having a light radiating surface and a heat dissipating surface opposite to the light radiating surface, and the heat dissipating surface disposing a plurality of soldering points thereon and the light radiating surface disposing a plurality of LEDs thereon wherein each LED has two conductive pins penetrating through the LED circuit board to protrude out from the heat dissipating surface and each soldering point completely covering each conductive pin; and
- a coating layer coating on the heat dissipating surface to cover the soldering points, wherein the coating layer is composed of Nanoparticles and a bonding agent, and is exposed to the environment; and
- a lamp tube for containing the LED circuit board, the lamp tube having a plurality of heat dissipation holes disposed on the left and right sides of the tube, the heat dissipation holes face toward the heat dissipating surface of the LED circuit board, wherein the Nanoparticles are heat radiative Nanoparticles which comprise clay and far infrared ceramic in sinter combinations of $ZrSiO_4$, $Al_2O_3$, $TiO_2$, and $(Ce,La,Nd)PO_4$ particles.

9. The LED tube including a heat dissipating structure of an LED circuit board according to claim 8, wherein the coating layer comprises 70%~80% weight of Nanoparticles, 10%~20% weight of the bonding agent and further comprising 10%~15% weight of solvent.

10. The LED tube including a heat dissipating structure of an LED circuit board according to claim 8, wherein the thickness of coating layer is 10 micron to 30 micron.

11. The LED tube including a heat dissipating structure of an LED circuit board according to claim 8, wherein the Nanoparticles are Boron Nitride particles.

12. The LED tube including a heat dissipating structure of an LED circuit board according to claim 11, wherein the coating layer comprises 70%~80% weight of Nanoparticles, 10%~20% weight of the bonding agent and further comprising 10%~20% weight of parting agent.

13. The LED tube including a heat dissipating structure of an LED circuit board according to claim 11, wherein the thickness of coating layer is 10 micron to 25 micron.

14. The LED tube including a heat dissipating structure of an LED circuit board according to claim 8, wherein the bonding agent is polyimide resin, acrylic resin or poly-ester resin.

15. The heat dissipating structure of an LED circuit board according to claim 1, wherein a plurality of LEDs are coupled on the light radiating surface, each LED includes a light emitting chip, two conductive pins and a light transmitting lens, and each conductive pin is disposed through the LED circuit board and the soldering point is formed thereon.

16. The LED tube including a heat dissipating structure of an LED circuit board according to claim 8, wherein each LED includes a light emitting chip, two conductive pins and a light transmitting lens, and each conductive pin is disposed through the LED circuit board and the soldering point is formed thereon.

* * * * *